(12) United States Patent
Hada et al.

(10) Patent No.: US 11,076,092 B2
(45) Date of Patent: Jul. 27, 2021

(54) IMAGE PROCESSING APPARATUS, IMAGE PROCESSING METHOD, AND IMAGE PROCESSING PROGRAM

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ryuji Hada, Yokohama Kanagawa (JP); Atsushi Masuda, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 16/286,261

(22) Filed: Feb. 26, 2019

(65) Prior Publication Data
US 2020/0092467 A1 Mar. 19, 2020

(30) Foreign Application Priority Data
Sep. 18, 2018 (JP) .............................. JP2018-173581

(51) Int. Cl.
*H04N 5/232* (2006.01)
*H01L 27/146* (2006.01)
*H04N 5/341* (2011.01)

(52) U.S. Cl.
CPC ... *H04N 5/23229* (2013.01); *H01L 27/14603* (2013.01); *H04N 5/341* (2013.01)

(58) Field of Classification Search
CPC .... H04N 5/23229; H04N 5/341; H04N 5/378; H01L 27/14603; G06T 1/60
See application file for complete search history.

(56) References Cited

U.S. PATENT DOCUMENTS 6,567,123 B1 * 5/2003 Hashimoto ...... H04N 5/232123
348/229.1
7,499,082 B2 3/2009 Iga
(Continued)

FOREIGN PATENT DOCUMENTS

EP 3355267 A1 8/2018
JP 2003266774 A 9/2003
(Continued)

OTHER PUBLICATIONS

Unpublished U.S. Appl. No. 16/122,378.
(Continued)

*Primary Examiner* — Jason A Flohre
(74) *Attorney, Agent, or Firm* — Kim & Stewart LLP

(57) ABSTRACT

An image processing apparatus includes first and second line buffers, an image processing circuit configured to perform an image processing on first pixel data stored in the first line buffer and then second pixel data stored in the second line buffer, and a controller configured to control writing of the second pixel data in the second line buffer at a timing aligned with a synchronizing signal and reading of the second pixel data written in the second line buffer for the image processing by the image processing circuit at a timing of a completion of the image processing by the image processing circuit of the first pixel data stored in the first line buffer.

9 Claims, 11 Drawing Sheets

(56) References Cited

U.S. PATENT DOCUMENTS

| | | | |
|---|---|---|---|
| 8,724,923 B2 | 5/2014 | Nakazono et al. | |
| 2003/0218683 A1* | 11/2003 | Kurase | H04N 5/217 |
| | | | 348/335 |
| 2008/0174822 A1* | 7/2008 | Kaimi | H04N 5/23248 |
| | | | 358/1.16 |
| 2008/0246984 A1 | 10/2008 | Shoji | |
| 2010/0110213 A1* | 5/2010 | Kimura | H04N 1/00931 |
| | | | 348/222.1 |
| 2013/0329069 A1* | 12/2013 | Kurashige | H04N 5/23245 |
| | | | 348/220.1 |
| 2017/0264823 A1* | 9/2017 | Takano | H04N 5/23245 |
| 2018/0220117 A1 | 8/2018 | Hada et al. | |
| 2019/0289231 A1 | 9/2019 | Hada | |

FOREIGN PATENT DOCUMENTS

| | | | |
|---|---|---|---|
| JP | 2005229200 A | 8/2005 | |
| JP | 2007079708 A | 3/2007 | |
| JP | 2008259070 A | 10/2008 | |
| JP | 2012033007 A | 2/2012 | |
| WO | 2013136458 A1 | 9/2013 | |

OTHER PUBLICATIONS

Hegarty et al. "Rigel: Flexible Multi-Rate Image Processing Hardware", ACM Transactions on Graphics, vol. 35, No. 4, Jul. 11, 2016, pp. 1-11.

Extended European Search Report dated Oct. 1, 2019 in corresponding European Patent Application No. 19159085.0, 7 pages.

\* cited by examiner

FIG. 11
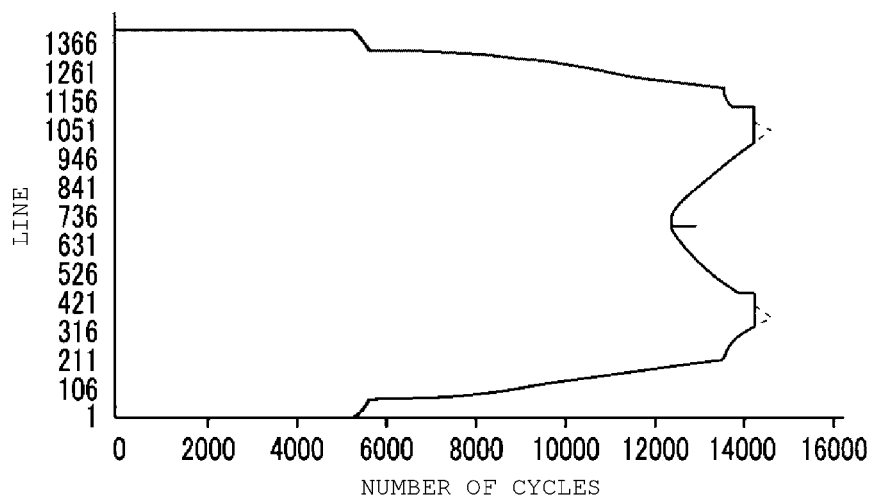
FIG. 12
| NUMBER OF BUFFERS | 2 (Read/Write) | 3 | 4 | 6 | 10 | 18 | 34 |
|---|---|---|---|---|---|---|---|
| AVERAGE | 1 | 0.94 | 0.93 | 0.92 | 0.90 | 0.89 | 0.87 |
| WORST VALUE | 1 | 0.99 | 0.99 | 0.99 | 0.98 | 0.97 | 0.96 |
| BEST VALUE | 1 | 0.64 | 0.64 | 0.62 | 0.61 | 0.60 | 0.59 |
FIG. 13
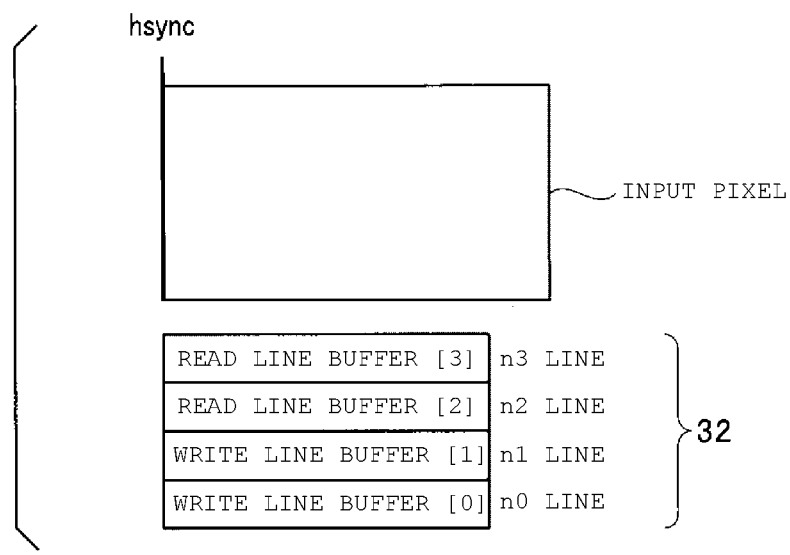

US 11,076,092 B2

IMAGE PROCESSING APPARATUS, IMAGE PROCESSING METHOD, AND IMAGE PROCESSING PROGRAM

CROSS-REFERENCE TO RELATED APPLICATION

This application is based upon and claims the benefit of priority from Japanese Patent Application No. 2018-173581, filed Sep. 18, 2018, the entire contents of which are incorporated herein by reference.

FIELD

Embodiments described herein relate generally to an image processing apparatus, an image processing method, and an image processing program.

BACKGROUND

An image processing apparatus for performing image processing on an image uses a line buffer to acquire and process the image data output from a capture apparatus, such as a digital camera, in real time. In such an image processing apparatus, a transmission rate of pixel data from the capture apparatus to the line buffer is fixed, and the pixel data corresponding to one line of the image is transferred to and stored in the line buffer in one horizontal synchronization cycle.

Such an image processing apparatus performs the image processing on the pixel data stored in the line buffer in units of a line within the horizontal synchronization cycle. In addition, time for completing the image processing may be different for each line. Since the pixel data is written in the line buffer in real time at the fixed rate, the operation frequency or computing unit of the image processing circuit is designed in view of the maximum number of cycles (hereinafter, referred to as the number of peak cycles) necessary to process the pixel data stored in the line buffer in real time.

DESCRIPTION OF THE DRAWINGS

FIG. 11 is a diagram illustrating a change in the number of cycles for each line necessary for completing a distortion process where the horizontal axis indicates the number of cycles and the vertical axis indicates a line of a screen.

FIG. 12 is a table illustrating, for 43 test patterns used for evaluation, a maximum value of the number of cycles to be processed in one horizontal synchronization period for each number of line buffers where the number of peak cycles is set to 1.

FIG. 13 is a diagram showing input line buffers according to a second embodiment.

DETAILED DESCRIPTION

Embodiments provide an image processing apparatus, an image processing method, and an image processing program in which it is possible to reduce a computing speed necessary for a circuit by smoothing the number of cycles which are necessary for a process in a plurality of line periods.

In general, according to one embodiment, an image processing apparatus comprises first and second line buffers, an image processing circuit configured to perform an image processing on first pixel data stored in the first line buffer and then second pixel data stored in the second line buffer, and a controller configured to control writing of the second pixel data in the second line buffer at a timing aligned with a synchronizing signal and reading of the second pixel data written in the second line buffer for the image processing by the image processing circuit at a timing of a completion of the image processing by the image processing circuit of the first pixel data stored in the first line buffer.

Hereinafter, embodiments of the present disclosure will be described in detail with reference to the accompanying drawings.

First Embodiment

Figure 1:
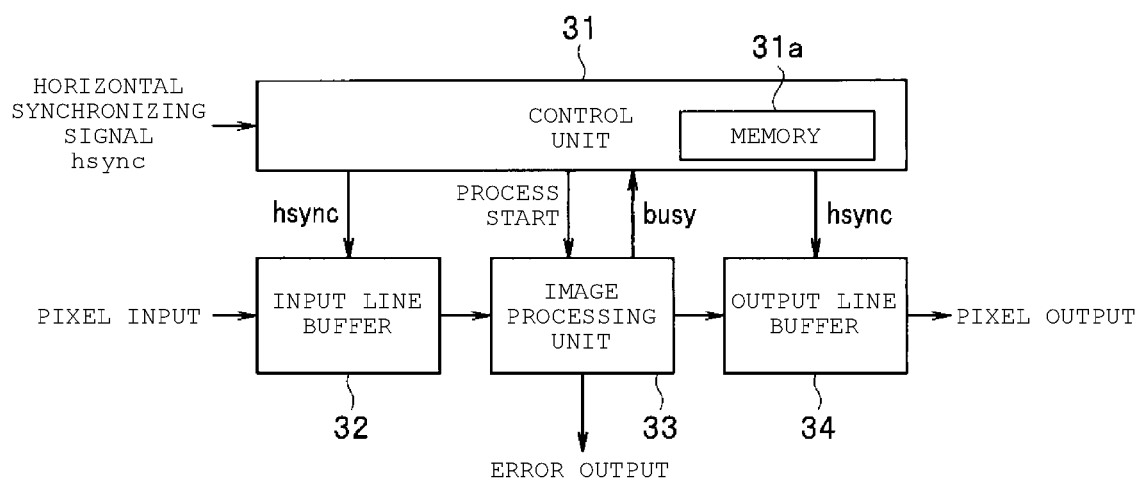
FIG. 1 is a block diagram illustrating an image processing apparatus according to an embodiment.
Figure 2:
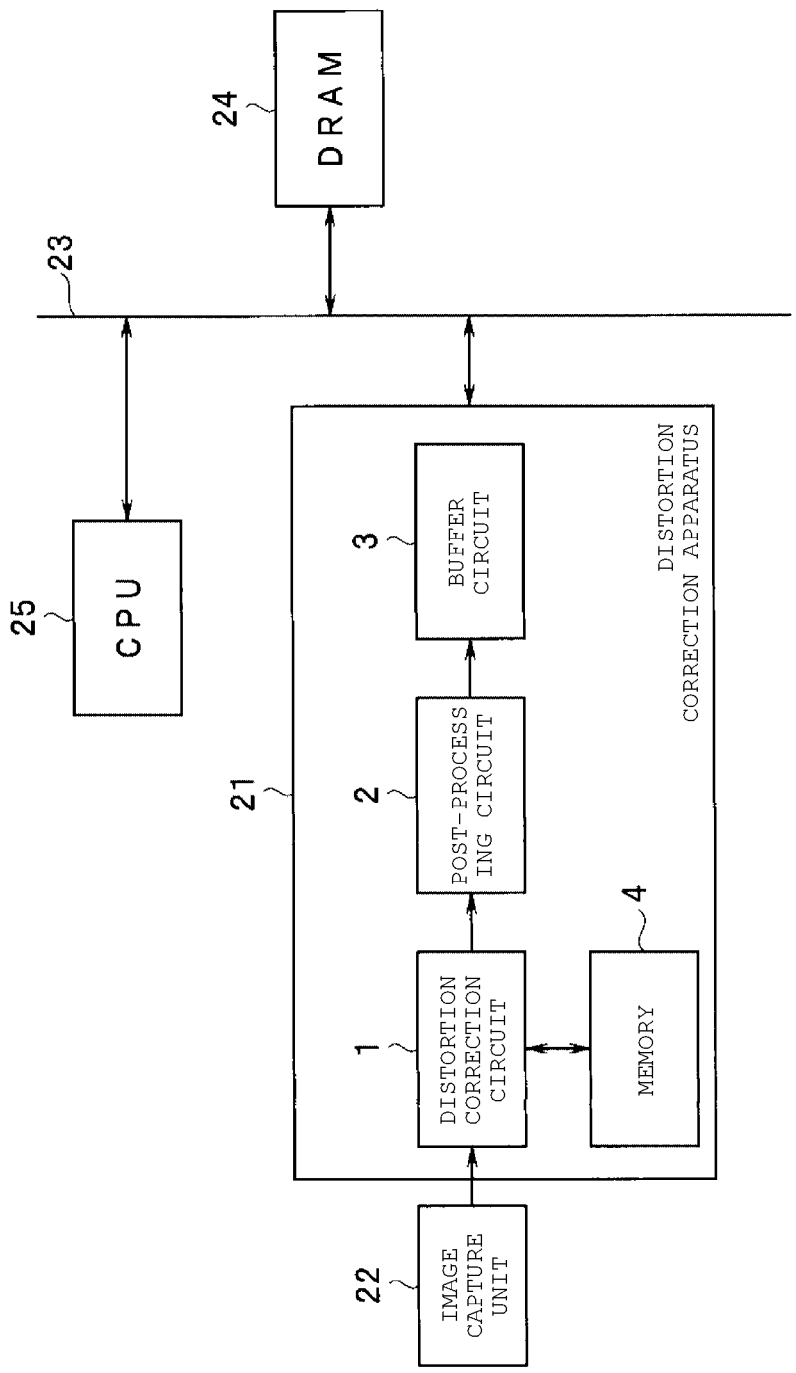
FIG. 2 is a block diagram illustrating a distortion correction apparatus configured using the image processing apparatus according to the embodiment.

FIG. 1 is a block diagram illustrating an image processing apparatus according to a first embodiment of the present disclosure. In addition, FIG. 2 is a block diagram illustrating a distortion correction apparatus configured using the image processing apparatus according to the embodiment.

In the embodiment, it is possible to smooth the number of cycles required for completing the image processing on pixel data of an image in units of a line by using a plurality of input buffers corresponding to write/read (or reference) targets in response to a horizontal synchronizing signal hsync and a signal indicative of start or end of the image processing in each line.

First, a distortion correction apparatus according to an application example of the embodiment will be described with reference to FIGS. 2 to 4. The embodiment is not limited to the distortion correction apparatus illustrated in FIG. 2, and may be applied to various apparatuses which write pixel data in the line buffer in real time at a fixed rate and which perform a process in units of a line.

When an image acquired by a camera is used for prevention of vehicle collision, a monitoring apparatus, and the like, a super-wide-angle lens may be used, and there is a tendency that a distortion aberration and a magnification chromatic aberration become large. The apparatus illustrated in FIG. 2 is used to electrically correct distortion, which is generated on an image due to the distortion aberration and the magnification chromatic aberration, through image processing.

The distortion correction apparatus illustrated in FIG. 2 includes a central processing unit (CPU) 25. The CPU 25 operates according to a program stored in a memory which is not illustrated in the drawing, and controls respective units. An image capturing unit 22 includes an element, such as a complementary metal-oxide-semiconductor (CMOS) sensor, which is not illustrated in the drawing. The image capturing unit 22 acquires a capture signal of a captured image by performing optical conversion on an optical image, which is incident through an optical system that is not illustrated in the drawing, using an image capturing element. An output of the image capturing unit 22 (i.e., the captured image) is given to a distortion correction apparatus 21, and distortion correction is performed thereon by the distortion correction apparatus 21. Thereafter, the output of the image capturing unit 22 is given to and stored in a dynamic random-access memory (DRAM) 24 through a bus 23. The captured image from the image capturing unit 22 has distortion due to the distortion aberration or the like of the optical system, and the distortion correction apparatus 21 performs various types of image processing such as distortion aberration correction.

The output from the image capturing unit 22 in order of raster scan is input to a distortion correction circuit 1 in the distortion correction apparatus 21. The distortion correction circuit 1 performs the distortion correction and the magnification chromatic aberration correction on the input captured image, and outputs a result to a post-processing circuit 2 using parameters stored in the memory 4. The post-processing circuit 2 performs gamma correction and color space correction on the input image, and outputs a result to the buffer circuit 3. The buffer circuit 3 temporarily holds the input image, and outputs the input image to the DRAM 24 through the bus 23. Therefore, an image, which is acquired through the distortion correction, is stored in the DRAM 24.

However, in the distortion correction according to the related art, the captured output, which is input in order of the raster scan, is accumulated once in the line buffer and is sequentially written in the DRAM in order of raster scan output. The distortion correction circuit according to the related art acquires an original pixel location acquired when the relevant output pixels do not receive distortion at the time of output in order of the raster scan, reads pixel data corresponding to the acquired pixel location from the line buffer, and transfer the pixel data to the DRAM. In the raster scan input and the raster scan output according to the related art, it is necessary to store the pixel data in the pixel location, which is acquired at the time of pixel data output, in the line buffer and it is necessary to secure sufficient capacity corresponding to a size of the distortion as the line buffer.

Here, in the specification of JP-A-2017-012870 which was previously filed, the applicant proposes a distortion correction process of reducing a line buffer through raster scan input and random output. In the raster scan input and the random output which are used in the proposal, control is performed such that input pixel data is stored at an address of the DRAM, which corresponds to the original pixel location (hereinafter, referred to as a correction pixel location) acquired when the relevant pixels do not receive the distortion. Accordingly, it is possible to use the line buffer which has a relatively small capacity.

Subsequently, the distortion correction process for the raster scan input and the random output, which is described in the specification of JP-A-2017-012870 that was previously filed, will be described in detail with reference to FIGS. 3 and 4.

Figure 3:
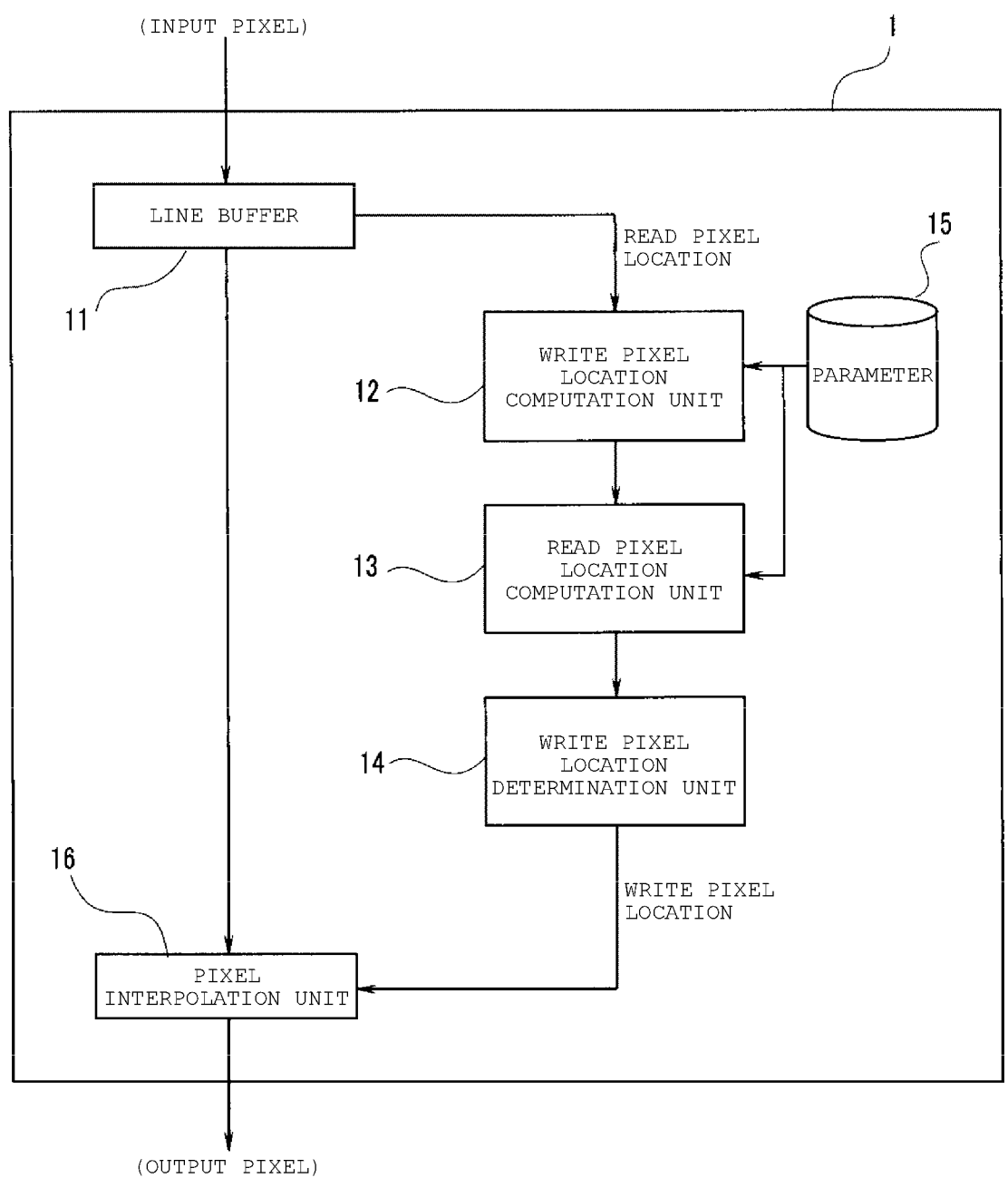
FIG. 3 is a block diagram illustrating the distortion correction circuit in FIG. 2.
Figure 4:
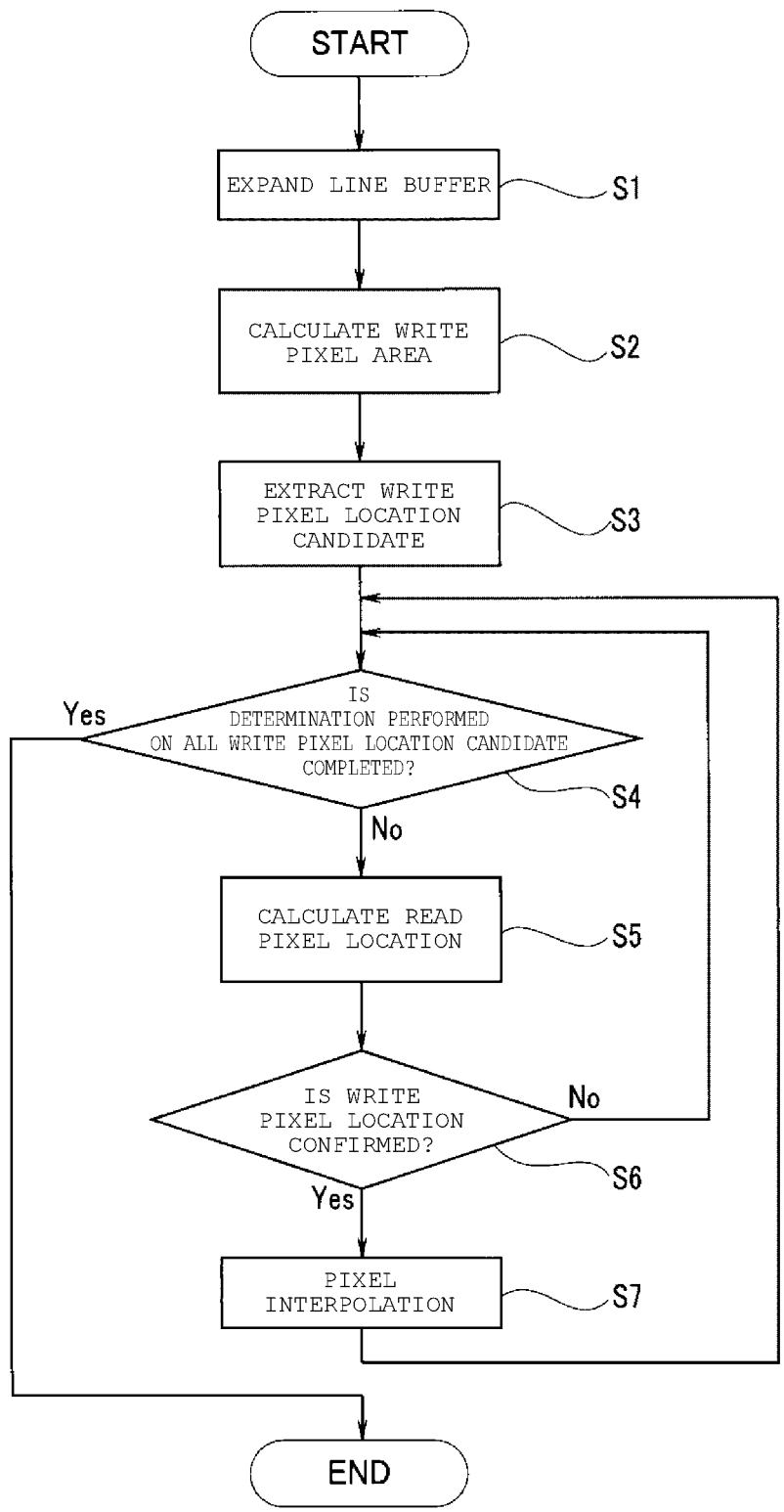
FIG. 4 is a flowchart illustrating a distortion correction process.

FIG. 3 is a block diagram illustrating the distortion correction circuit 1 in FIG. 2.

In FIG. 3, the distortion correction circuit 1 primarily includes a line buffer 11, a write pixel location computation unit 12, a read pixel location computation unit 13, a write pixel location determination unit 14, a parameter storage unit 15, and a pixel interpolation unit 16.

The line buffer 11 holds the input pixel data of the input image, which are read from the image capturing unit 22 in order of the raster scan, as many as the number of lines which are necessary for the correction process. For example, when the distortion aberration correction is performed using bilinear interpolation, pixels corresponding to one or two lines are held.

The write pixel location computation unit 12 calculates a write pixel area which is estimated that a pixel interpolated using a read pixel Pi that is a correction target is included. Specifically, a read pixel location set is defined which includes pixels {Pi0(vo, ho), Pi1(vo, ho−1), Pi2(vo−1, ho−1), and Pi3(vo−1, ho)} of four adjacent points including a location (vo, ho) of the read pixel Pi (hereinafter, illustrated as a pixel Pi(vo, ho)). In the description, in pixel location coordinates (v, h), an upper left of the image is set to an origin (0, 0), a vertical pixel location is set to v, and a horizontal pixel location is set to h.

For the respective read pixels Pi0, Pi1, Pi2, and Pi3, locations (vo', ho'), (vo', ho−1'), (vo−1', ho−1'), and (vo−1', ho') of relevant write pixels Po0, Po1, Po2, and Po3 are calculated using a function of pixel location computation. A rectangular area, which includes pixels Po0(vo', ho'), Po1 (vo', ho−1'), Po2(vo−1', ho−1'), and Po3(vo−1', ho') of four points as vertexes, is set as the write pixel area.

In the pixel location computation, it is possible to use, for example, a general pixel location computation function, such as a function expressed in a polynomial expression or grid table conversion. However, the pixel location computation function, in which an inverse function exists, is used.

The read pixel location computation unit 13 extracts a pixel location of which both a vertical location and a horizontal location become integers (i.e., write pixel candidate Poc(v', h')) in the write pixel area. Furthermore, a read pixel Pi(v", h") corresponding to the write pixel candidate Poc(v', h') is calculated by performing the pixel location computation. The pixel location computation is performed using an inverse function of the pixel location computation performed by the write pixel location computation unit 12. When a plurality of candidates exist, the read pixel Pi(v", h") is calculated with respect to all the candidates Poc(v', h').

When the read pixel Pi(v", h") is included in the set, the write pixel location determination unit 14 confirms the write pixel candidate Poc(v', h') with respect to the pixel Pi(v", h") as a write pixel Po(v', h') of the correction pixel location.

The parameter storage unit 15 stores the parameters used for the pixel location computation function in the write pixel location computation unit 12 and the read pixel location computation unit 13.

The pixel interpolation unit 16 calculates a pixel value of the read pixel Pi(v", h") corresponding to the confirmed write pixel Po(v', h'). Usually, coordinates of the read pixel Pi(v", h") are non-integers, and thus the pixel value is calculated using an existing interpolation method such as the bilinear interpolation or the like using, for example, four adjacent pixels. The calculated pixel value is output as a pixel value of the write pixel Po(v', h'). The output pixel value is stored in a memory (not illustrated in the drawing) such as the DRAM. The output pixel is output in order that the correction is performed, and thus a location of the output pixel (i.e., corrected pixel location) becomes random.

Subsequently, a sequence of the distortion correction process in the distortion correction circuit 1 will be described. FIG. 4 is a flowchart illustrating the distortion correction process.

First, the pixel data which is input to the distortion correction circuit 1 in order of the raster scan are expanded to the line buffer 11 (S1). The line buffer 11 stores the input pixel data corresponding to the number of lines which are necessary for the process in the pixel interpolation unit 16. For example, when the bilinear interpolation is used, the pixel values of 2×2 pixels (i.e., 4 pixels) in the vicinity of an interpolation target pixel are necessary, and thus the pixel values corresponding to at least one line+one pixel are stored.

Subsequently, the read pixel Pi(vo, ho), which is a correction target pixel, is specified, and the write pixel area, which is estimated to include the pixels interpolated using the read pixel Pi, is calculated (S2). Specifically, first, a set is defined which includes the four adjacent pixels {Pi0(vo, ho), Pi1(vo, ho−1), Pi2(vo−1, ho−1), and Pi3(vo−1, ho)} including the read pixel Pi(vo, ho). That is, Pi1(vo, ho−1) is a pixel on the left of Pi(vo, ho), Pi2(vo−1, ho−1) is a pixel on the upper left of Pi(vo, ho), and Pi3(vo−1, ho) is a pixel on Pi(vo, ho). Subsequently, the pixel location computation is performed on the respective pixels Pi0, Pi1, Pi2, and Pi3, and the relevant write pixels Po0(vo', ho'), Po1(vo', ho−1'), Po2(vo−1', ho−1'), and Po3(vo−1', ho') are calculated.

When the function which is expressed through, for example, the polynomial expression is used, the pixel location computation is performed by the following procedures.

(a) Calculation of imaged height: a location of the input pixel is converted from a coordinate system of (v, h) in which an upper left is set as the origin into a coordinate system of (x, y) in which an optical center is set as the origin. In both the coordinate systems, a horizontal direction is positive on a right side and a vertical direction is positive on a lower side. In addition, a distance r (also referred to as the imaged height) from the optical center to the input pixel location is calculated. The calculation is performed using the following equations (1) to (3).

$$y = v_{in} + [\text{SENSOR\_CROP\_OFS\_}V] \qquad (1)$$

$$x = h_{in} + [\text{SENSOR\_CROP\_OFS\_}H] \qquad (2)$$

$$r = \sqrt{x^2 + y^2} * [\text{NORM\_SCALE}] \qquad (3)$$

In Equation (1), $v_{in}$ is an input pixel location (non-negative number) in the vertical direction, and [SENSOR_CROP_OFS_V] is a vertical pixel location offset from the optical center (i.e., an offset in the vertical direction between the optical center and the origin of a (v, h) coordinate system). In addition, in Equation (2), $h_{in}$ is an input pixel location (non-negative number) in the horizontal direction and [SENSOR_CROP_OFS_H] is a horizontal pixel location offset from the optical center (i.e., an offset in the horizontal direction between the optical center and the origin of the (v, h) coordinate system). In addition, in Equation (3), [NORM_SCALE] is a normalization factor (non-negative number).

When a center of the image coincides with the optical center, [SENSOR_CROP_OFS_V] and [SENSOR_CROP_OFS_H] are expressed as in the following Equations (4) and (5).

$$[\text{SENSOR\_CROP\_OFS\_}V] = -(\text{vertical size of input image}/2 - 0.5) \qquad (4)$$

$$[\text{SENSOR\_CROP\_OFS\_}H] = -(\text{horizontal size of input image}/2 - 0.5) \qquad (5)$$

(b) Calculation of imaged height scale in pixel location computation: a distance r_scale, in which a point located at a distance r from the optical center is moved in the optical center direction through the pixel location conversion, is calculated. The calculation is performed using the following Equation (6).

$$r\_scale = P0 + P1*r + P2*r^2 + P3*r^3 + P4*r^4 + P5*r^5 + P6*r^6 + P7*r^7 + P8*r^8 + P9*r^9 + P10*r^{10} \qquad (6)$$

In Equation (6), Px(x=0 to 10) is a polynomial expression coefficient according to each degree.

(c) Calculation of output pixel location: the input pixel location is converted into an output pixel location using the imaged height scale, and the process returns to the (v, h) coordinate system. The calculation is performed using the following Equations (7) and (8).

$$v_{out} = r\_scale * y - [\text{SENSOR\_CROP\_OFS\_}V] \qquad (7)$$

$$h_{out} = r\_scale * x - [\text{SENSOR\_CROP\_OFS\_}H] \qquad (8)$$

In Equation (7), $v_{out}$ is the output pixel location (non-negative number) in the vertical direction. In Equation (8), $h_{out}$ is the output pixel location (non-negative number) in the horizontal direction.

That is, due to a series of procedures (a) to (c), the read pixels Pi(vo, ho), Pi1(vo, ho−1), Pi2(vo−1, ho−1), and Pi3(vo−1, ho) are respectively converted into the write pixels Po0(vo', ho'), Po1(vo', ho−1'), Po2(vo−1', ho−1'), and Po3(vo−1', ho').

When the function, which is expressed in the above described polynomial expression, is used as the pixel location computation, it is assumed that the respective parameters [SENSOR_CROP_OFS_V], [SENSOR_CROP_OFS_H], [NORM_SCALE], and Px(x=0 to 10) are set in advance and are stored in the parameter storage unit 15.

It is possible to perform the pixel location computation using the grid table conversion. The grid table is a 2-dimensional address table in which a pixel location (v, h) is set to a grid node. Each grid node stores a conversion destination pixel location. An address corresponding to a random pixel location which is located between grid nodes is calculated by performing interpolation from the adjacent grid nodes. When the grid table conversion is used as the pixel location computation, the grid table conversion is performed by the following procedures.

(d) Calculation of reference grid node: a grid node, which is located on the upper left of the input pixel, is determined as a reference grid node. The calculation is performed using the following Equations (9) and (10).

$$\text{ref\_}v = v_{in} * \text{GRID\_PATCH\_}V\text{SIZE\_INV} \qquad (9)$$

$$\text{ref\_}h = h_{in} * \text{GRID\_PATCH\_}H\text{SIZE\_INV} \qquad (10)$$

In Equation (9), $v_{in}$ is the input pixel location (non-negative number) in the vertical direction, and GRID_PATCH_VSIZE_INV is an inverse number of a distance between vertical grid nodes. GRID_PATCH_VSIZE_INV is calculated using the following Equation (11).

$$\text{GRID\_PATCH\_}V\text{SIZE\_INV} = 1/([\text{SENSOR\_CROP\_}V\text{SIZE}] - 1)/([\text{GRID\_NODE\_NUM\_}V] - 1) \qquad (11)$$

In Equation (11), [SENSOR_CROP_VSIZE] is a vertical size of the input image and [GRID_NODE_NUM_V] is the number of vertical grid nodes.

In addition, in Equation (10), $h_{in}$ is the input pixel location (non-negative number) in the horizontal direction and GRID_PATCH_HSIZE_INV is an inverse number of a distance between horizontal grid nodes. GRID_PATCH_HSIZE_INV is calculated using the following Equation (12).

$$\text{GRID\_PATCH\_HSIZE\_INV} = \frac{1}{([\text{SENSOR\_CROP\_HSIZE}]-1)/([\text{GRID\_NODE\_NUM\_H}]-1)} \quad (12)$$

In Equation (12), [SENSOR_CROP_HSIZE] is a horizontal size of the input image and [GRID_NODE_NUM_H] is the number of horizontal grid nodes.

(e) Calculation of weight: a weight is calculated based on a ratio of a distance in the vertical direction to a distance in the horizontal direction with respect to the grid nodes of the four adjacent points, including the reference grid node, from the input pixel location. The weight is calculated using the following Equations (13) and (14).

$$\text{weight\_}v = \text{ref\_}v - [\text{ref\_}v] \quad (13)$$

$$\text{weight\_}h = \text{ref\_}h - [\text{ref\_}h] \quad (14)$$

In Equations (13) and (14), [ ] indicates the Gauss symbol. The weight in the vertical direction relevant to the reference grid node is 1-weight_v. In addition, the weight in the horizontal direction relevant to the reference grid node is 1-weight_h.

(f) Calculation of output pixel location: the output pixel location is calculated through the bilinear interpolation using a table of the grid nodes of the four adjacent pixels including the reference grid node and the weight of each of the grid nodes with respect to the input pixel location.

(f-1) Calculation of Output Pixel Location in Vertical Direction

The output pixel location in the vertical direction is calculation using the following Equations (15) to (17).

$$v0_{out} = \text{table\_}v(\text{ref\_}v, \text{ref\_}h)*(1-\text{weight\_}h) + \text{table\_}v(\text{ref\_}v, \text{ref\_}h+1)*\text{weight\_}h \quad (15)$$

$$v1_{out} = \text{table\_}v(\text{ref\_}v+1, \text{ref\_}h)*(1-\text{weight\_}h) + \text{table\_}v(\text{ref\_}v+1, \text{ref\_}h+1)*\text{weight\_}h \quad (16)$$

$$v_{out} = v0_{out}*(1-\text{weight\_}v) + v1_{out}*\text{weight\_}v \quad (17)$$

In Equations (15) and (16), table_v(v, h) is a vertical pixel location grid table. In addition, in Equation (17), $v_{out}$ is the output pixel location (non-negative number) in the vertical direction.

(f-2) Calculation of Output Pixel Location in Horizontal Direction

The output pixel location in the horizontal direction is calculated using the following Equations (18) to (20).

$$h0_{out} = \text{table\_}h(\text{ref\_}v, \text{ref\_}h)*(1-\text{weight\_}h) + \text{table\_}h(\text{ref\_}v, \text{ref\_}h+1)*\text{weight\_}h \quad (18)$$

$$h1_{out} = \text{table\_}h(\text{ref\_}v+1, \text{ref\_}h)*(1-\text{weight\_}h) + \text{table\_}h(\text{ref\_}v+1, \text{ref\_}h+1)*\text{weight\_}h \quad (19)$$

$$h_{out} = h0_{out}*(1-\text{weight\_}h) + h1_{out}*\text{weight\_}v \quad (20)$$

In Equations (18) and (19), table_h(v, h) is a horizontal pixel location grid table. In addition, in Equation (20), $h_{out}$ is the output pixel location (non-negative number) in the horizontal direction.

That is, the read pixels Pi(vo, ho), Pi1(vo, ho−1), Pi2(vo−1, ho−1), and Pi3(vo−1, ho) are converted into the write pixels Po0(vo', ho'), Po1(vo', ho−1'), Po2(vo−1', ho−1'), and Po3(vo−1', ho'), respectively, through a series of procedures from (d) to (f).

When the above-described grid table conversion is used as the pixel location computation, it is assumed that the respective parameters [SENSOR_CROP_VSIZE], [GRID_NODE_NUM_V], [SENSOR_CROP_HSIZE], [GRID_NODE_NUM_H], table_v(v, h), and table_h(v, h) are set in advance and are stored in the parameter storage unit 15.

The rectangular area, in which the pixels Po0(vo', ho'), Po1(vo', ho−1'), Po2(vo−1', ho−1'), and Po3(vo−1', ho') of the four points calculated through the pixel location computation are used as the vertexes, is specified as the write pixel area.

Subsequently, in the specified rectangular area, the pixel location (the write pixel candidate Poc(v', h')), in which both the vertical coordinates and the horizontal coordinates become integers, is extracted. For example, the respective coordinates of the pixels Po0(vo',ho'), Po1(vo', ho−1'), Po2(vo−1', ho−1'), and Po3(vo−1', ho') are adjusted through rounding up and rounding down so as to be integers, and all the pixel locations in the rectangular area which circumscribes the acquired pixel locations are set to the write pixel candidate Poc(v', h') (S3). The adjustment through rounding up and rounding down so as to be integers is performed using the following Equations (21) and (22). Equation (21) is used for a pixel which is located on the left side or the upper side of the four points, and Equation (22) is used for a pixel which is located on the right side or the lower side.

$$\text{Pixel location after adjustment} = [\text{write pixel location} - \text{WRITE\_AREA\_DELTA}] \quad (21)$$

$$\text{Pixel location after adjustment} = [\text{write pixel location} + \text{WRITE\_AREA\_DELTA}] \quad (22)$$

In Equations (21) and (22), WRITE_AREA_DELTA is an adjustment value to be an integer and is set in advance. In addition, [ ] indicates the Gauss symbol.

Subsequently, it is determined whether or not each of all the write pixel candidates Poc(v', h') acquired in S3 is the write pixel Po(v', h'). When there is the write pixel candidate Poc(v', h') on which the determination is not yet made (S4, No), the relevant read pixel Pi(v", h") is calculated through the pixel location computation (S5). The pixel location computation is performed using the inverse function of the pixel location computation used in S2. Here, the vertical coordinates and the horizontal coordinates of the Pi(v", h") are non-integers.

Subsequently, pixels, which are necessary to calculate the pixel value of Pi(v", h") through the interpolation, are specified. For example, when the pixel value is calculated through the bilinear interpolation, four adjacent pixels of Pi(v", h") are pixels which are necessary for the interpolation. When all the pixels which are necessary for the interpolation are included in the set, the write pixel candidate Poc(v', h') corresponding to the read pixel Pi(v", h") is confirmed as the write pixel Po(v', h') (S6, Yes).

Here, the pixel value of the confirmed write pixel Po(v', h') is output by calculating the pixel value of the relevant read pixel Pi(v", h") through the pixel interpolation (S7). The output pixel Po(v', h') is random without being in order of the raster scan. Subsequently, the process returns to S4, and existence/non-existence of the write pixel candidate Poc(v', h') on which the determination is not made is checked.

In contrast, when a pixel which is not included in the set exists in the pixels which are necessary for the interpolation, it is determined that the write pixel candidate Poc(v', h') corresponding to the read pixel Pi(v", h") is not the write pixel Po(v', h') (S6, No). Here, the pixel interpolation is not performed, the process returns to S4, and the existence/non-existence of the write pixel candidate Poc(v', h') on which the determination is not made is checked.

In S4, when the determination is made on all the write pixel candidates Poc(v', h') acquired in S3, the series of procedures of the image correction process ends (S4, Yes).

In the distortion correction process performed by the above-described distortion correction circuit 1, the correction process is performed on the input pixels, which are read from the image capturing unit 22 in order of the raster scan, in order of the raster scan. Accordingly, it is possible to limit a range of the input pixels, which are necessary for the correction, to the extent of one to several lines, and thus it is possible to reduce a loading quantity of the line buffer 11 which stores the input pixel data, thereby suppressing manufacturing costs.

The loading quantity of the line buffer 11 is set according to a pixel interpolation method. For example, when a bilinear method is used, approximately two lines may be loaded. When a bi-cubic method is used, it is necessary to load approximately four lines.

In addition, a pixel location computation method for calculating the write pixel from the read pixel is not limited to the above-described method. That is, a random method in which the inverse function exists may be used. In addition, a plurality of pixel location computation methods maybe combined.

As above, when the distortion correction circuit, which is disclosed in the specification of JP-A-2017-012870 that is previously filed, is used as the distortion correction circuit 1 in FIG. 2, the correction process is performed on the input pixels, which are read from the image capturing unit 22 in order of the raster scan, in order of the raster scan. For example, the line buffers corresponding to 2 lines are prepared, a process is performed in units of a line while inputting the pixel data to the line buffers in real time at the fixed rate, and thus it is possible to output pixel data including pieces of information of the correction pixel locations.

Smoothing of Number of Cycles

The embodiment is applied to various apparatuses which write the pixel data in the line buffer in real time at the fixed rate and perform the process in units of a line, and may be applied to apparatuses other than the distortion correction apparatus in FIG. 2.

Figure 5:
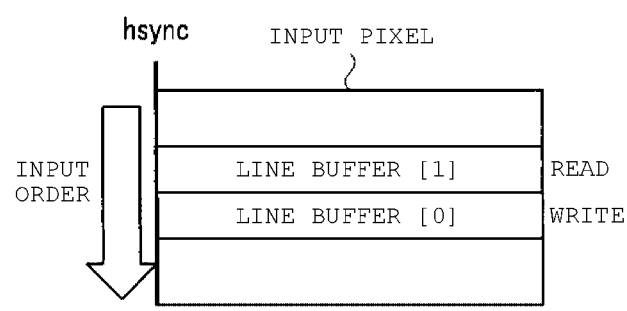
FIG. 5 is a diagram illustrating write and read in and from line buffers in units of a line.

FIG. 5 is a diagram illustrating write and read in and from the line buffer in the process in units of a line. In FIG. 5, [0] and [1] indicate IDs which are given to the line buffers (hereinafter, referred to as the line buffer IDs). FIG. 5 illustrates that the horizontal synchronizing signal hsync is generated to correspond to start locations of the respective lines included in one screen and that write and read of the pixel data in and from the line buffers [0] and [1], which are capable of storing the pixels corresponding to the prescribed 2 lines, are controlled in synchronization with the horizontal synchronizing signal hsync. After write of one line is performed on the line buffer [0], write of one line is performed on the line buffer [1] in synchronization with a subsequently generated horizontal synchronizing signal hsync. In addition, when the write of one line is performed on the line buffer [1], pixel data corresponding to the one line are read from the line buffer [0], and thus prescribed image processing is performed. That is, FIG. 5 illustrates an example of write and read data in separate line buffers.

Generally, a size of the distortion of the image differs according to a location on the screen. For example, when the super-wide-angle lens is used, barrel-shaped distortion is generated, and the distortion becomes large at peripheral parts of the screen compared to a center of the screen. Moreover, it is known that trapezoidal distortion and pincushion distortion maybe observed on the image depending on the imaging condition. Accordingly, the number of cycles, which are necessary for the distortion correction, changes for each line.

Figure 6:
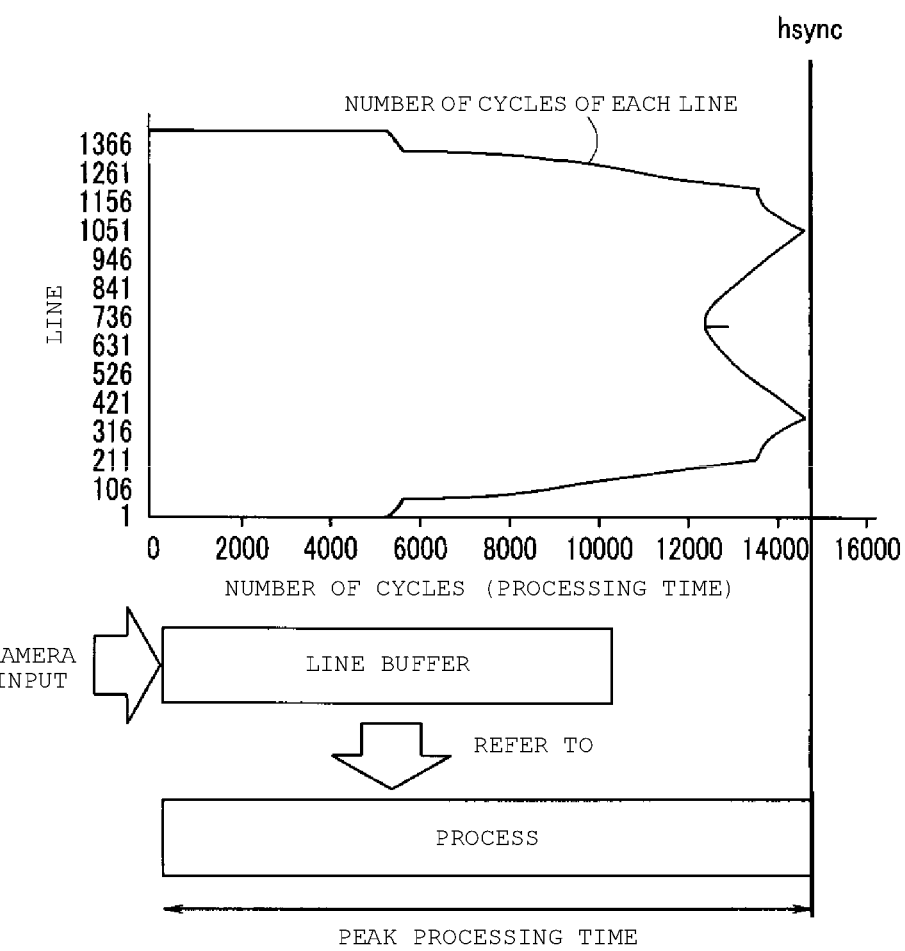
FIG. 6 is a diagram illustrating a change in the number of cycles for each line necessary for completing a distortion process where the horizontal axis indicates the number of cycles and the vertical axis indicates a line of a screen.

FIG. 6 is a diagram illustrating the change in the number of cycles necessary for completing the distortion correction process for each line. In FIG. 6, the horizontal axis indicates the number of necessary cycles, and the vertical axis indicates the line of the screen. FIG. 6 illustrates an example of the distortion correction process performed on the barrel-shaped distortion, and the number of cycles becomes peak in lines which are separated from an upper end and a lower end of the screen by the prescribed number of lines. When a line buffer on which write has been performed is switched over to a line buffer on which read is performed as illustrated in FIG. 5, the written pixel data is read or referred to and processed in a period between horizontal synchronizing signals hsyncs (hereinafter, referred to as a horizontal synchronization period). The circuit is designed such that a process of a peak value of the number of cycles (i.e., the number of peak cycles) illustrated in FIG. 6 is performed in the horizontal synchronization period.

Figure 7:
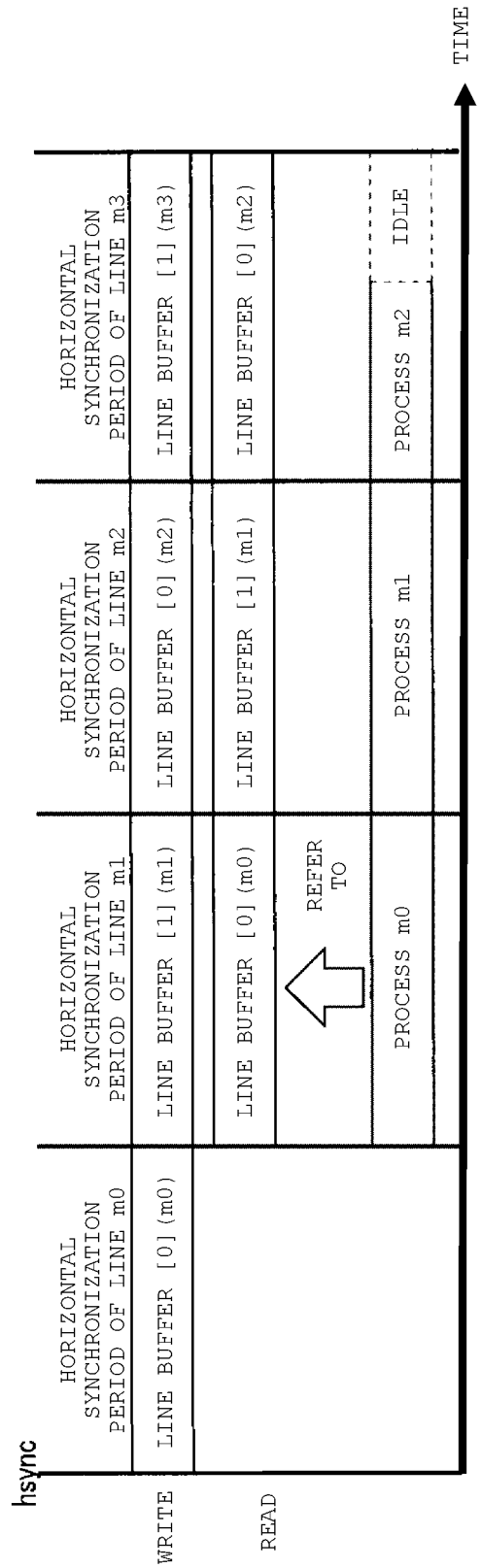
FIG. 7 is a diagram illustrating a processing sequence of pixel data of an image in units of a line.

FIG. 7 is a diagram illustrating a processing sequence when the circuit is designed as described above. In FIG. 7, two line buffers [0] and [1], in which line buffer IDs are [0] and [1], are used and a period in which a process is performed on pixel data of successive lines m0 to m3 (i.e., a horizontal synchronization period of lines m0 to m3) is illustrated. The lines m0 and m1 are lines in which it is necessary to process the number of peak cycles. In FIG. 7, the horizontal axis indicates time, and thick vertical lines indicate the timings at which the horizontal synchronizing signals hsyncs are generated. Whenever the horizontal synchronizing signal hsync is generated, write in the line buffer starts and image processing in which the line buffer is read or referred to starts.

In the horizontal synchronization period of the line m0 of FIG. 7, pixel data of the line m0 is written in the line buffer [0]. In the subsequent horizontal synchronization period of the line m1, pixel data of the line m1 is written in the line buffer [1], and pixel data of the line m0 is referred to from the line buffer [0] and processed (process m0). In the subsequent horizontal synchronization period of the line m2, pixel data of the line m2 is written in the line buffer [0] and the pixel data of the line m1 is referred to from the line buffer [1] and processed (process m1). Although the number of peak cycles is necessary for the processes m0 and m1, the circuit is designed such that it is possible to process the number of peak cycles in one horizontal synchronization period, and thus the processes can be completed successfully.

In the subsequent horizontal synchronization period of the line m3, pixel data of the line m3 is written in the line buffer [1]. In addition, the pixel data of the line m2 is referred to from the line buffer [0] and processed (process m2). The number of cycles, which are necessary for the process m2, is sufficiently smaller than the number of peak cycles, and the process ends within a relatively short processing time. As described above, in the horizontal synchronization period of the line m3, there is a useless idle time period in which the image processing cannot be performed.

Figure 8:
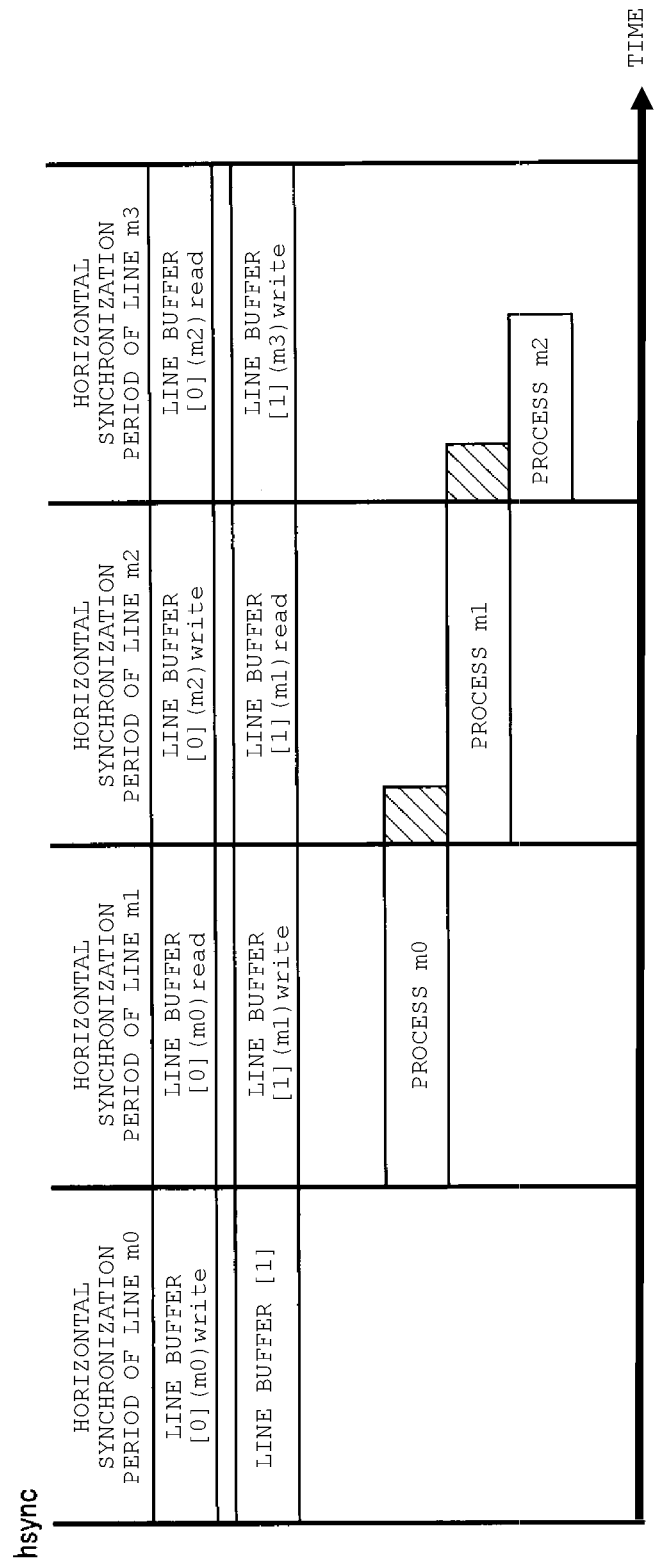
FIG. 8 is a diagram illustrating a processing sequence of the pixel data in units of a line for comparison.

In contrast, FIG. 8 is a diagram illustrating a processing sequence performed by the circuit designed such that the number of cycles to be processed in one horizontal synchronization period is smaller than the number of peak cycles so as to reduce the idle time when the same image processing as in FIG. 7 is performed on the same lines as in FIG. 7. The case is illustrated using the same description method as in FIG. 7.

Here, the process m0 does not end in the horizontal synchronization period of the line m1 and extends to the subsequent horizontal synchronization period of the line m2 as illustrated using a hatched section. However, actually, in the horizontal synchronization period of the line m2, the pixel data of the line m2 is written in the line buffer [0]. Therefore, it is not possible to refer to the pixel data of the line m0 and the process illustrated using the hatched lines fails.

In the same manner, the process m1 does not end in the horizontal synchronization period of the line m2 and extends to the subsequent horizontal synchronization period of the line m3 as illustrated using a hatched section. However, actually, the pixel data of the line m3 is written in the line buffer [1] in the horizontal synchronization period of the line m3. Therefore, it is not possible to refer to the pixel data of the line m1 and the process illustrated using the hatched section may fail.

As above, when it is not possible to process the number of peak cycles in one horizontal synchronization period, write is performed before referring to the pixel data, and thus the process fails.

Here, in the embodiment, the image processing apparatus illustrated in FIG. 1 is used as the distortion correction circuit 1 of FIG. 2. Hereinafter, a configuration of a case where the apparatus of FIG. 1 is applied to the distortion correction apparatus will be described.

In FIG. 1, the control unit 31 (also referred to as the controller) may include a processor which uses the CPU or the like, may operate according to a program stored in the memory, which is not illustrated in the drawing, so as to control the respective units, and may perform some or all the functions in an electronic circuit of hardware.

The input line buffer 32 includes the line buffers corresponding to one or more lines to a number of line buffers which are necessary for the image processing to be applied. For example, the input line buffer 32 includes the line buffers corresponding to one or more lines to the above-described line buffer 11 of FIG. 3. The write and read in or from the input line buffer 32 are controlled by the control unit 31, and the input line buffer 32 stores the input pixel data and outputs the input pixel data to the image processing unit 33.

The image processing unit 33 has the same processing function as the distortion correction circuit 1 of FIG. 3. The processing of the image processing unit 33 is controlled by the control unit 31, and the image processing unit 33 performs the distortion correction process for the raster scan input and the random output using the parameters stored in the memory 4. When the embodiment is applied to an apparatus which does not perform the distortion correction process but performs another image processing, the image processing unit 33 performs the applied image processing.

The image processing unit 33 is controlled by the control unit 31, and outputs pixel data acquired after the image processing to the output line buffer 34. The output line buffer 34 is controlled by the control unit 31 and outputs written pixel data in synchronization with the horizontal synchronizing signal hsync. In the example of FIG. 2, an output of the output line buffer 34 is given to the post-processing circuit 2.

The horizontal synchronizing signal hsync based on the input image is input to the control unit 31. For example, the horizontal synchronizing signal hsync is given to the control unit 31 from the image capturing unit 22. The control unit 31 gives a signal used to start a process (hereinafter called the process start signal) to the image processing unit 33, and receives a process end signal (hereinafter called the busy signal) from the image processing unit 33. When the image processing unit 33 receives the process start signal from the control unit 31, the image processing unit 33 starts the process in units of a line and sets the busy signal to, for example, "1" which indicates that the process is being performed. When the process in units of a line ends, the image processing unit 33 sets the busy signal to, for example, "0" which indicates that the process has ended, and outputs the busy signal to the control unit 31.

The control unit 31 gives IDs to the plurality of respective line buffers in the input line buffer 32 (hereinafter, referred to as line buffer IDs), and performs management by storing pieces of information (hereinafter, referred to as buffer management information) relevant to a line buffer ID of a read target (hereinafter, referred to as the read ID) and a line buffer ID of a write target (hereinafter, referred to as the write ID) in a memory 31a. The control unit 31 updates the read ID and the write ID, which are the pieces of buffer management information, based on the horizontal synchronizing signal hsync and the busy signal such that it is possible to smooth the number of cycles to be processed while the image processing, which is performed on the image that is input in real time, do not fail. Therefore, it is possible to reduce the number of cycles which should be processed in one horizontal synchronization period.

That is, the control unit 31 updates the write ID when the horizontal synchronizing signal hsync is input, and updates the read ID according to the busy signal which indicates that the process in units of a line has ended. That is, when the horizontal synchronizing signal hsync is input, the control unit 31 switches over the line buffer on which write is performed, and starts writing the pixel data in the input line buffer 32 in synchronization with the horizontal synchronizing signal hsync. That is, it is possible for the image processing apparatus of FIG. 1 to acquire the pixel data in units of a line in the input line buffer 32 in real time.

In addition, when it is indicated that the process in units of a line has ended using the busy signal, the control unit 31 immediately switches over the line buffers to be referred to and performs the imaging processing when the pixel data to be processed has been stored in the input line buffer 32. On the other hand, when the pixel data to be processed has not been written to the input line buffer 32 (e.g., the data is being written to the buffer 32), the control unit 31 refers to the line buffer designated by the read ID in synchronization with the subsequent horizontal synchronizing signal hsync and then performs the image processing on the designated input line buffer.

As described above, the control unit 31 controls the line buffers including additional line buffers corresponding to the read target and the write target, thereby smoothing time in which each line is processed, that is, smoothing the number of cycles to be processed in one horizontal synchronization period.

As described above, it is described that the input line buffer 32 includes one or more line buffers in addition to the line buffers corresponding to one or more lines which are necessary for the image processing to be applied. However, when a processing speed is relatively slow in the image processing unit 33, the image processing may fail if the number of line buffers to be added is small. Here, when the image processing fails, the image processing unit 33 outputs an error output which indicates that the image processing fails.

Figure 9:
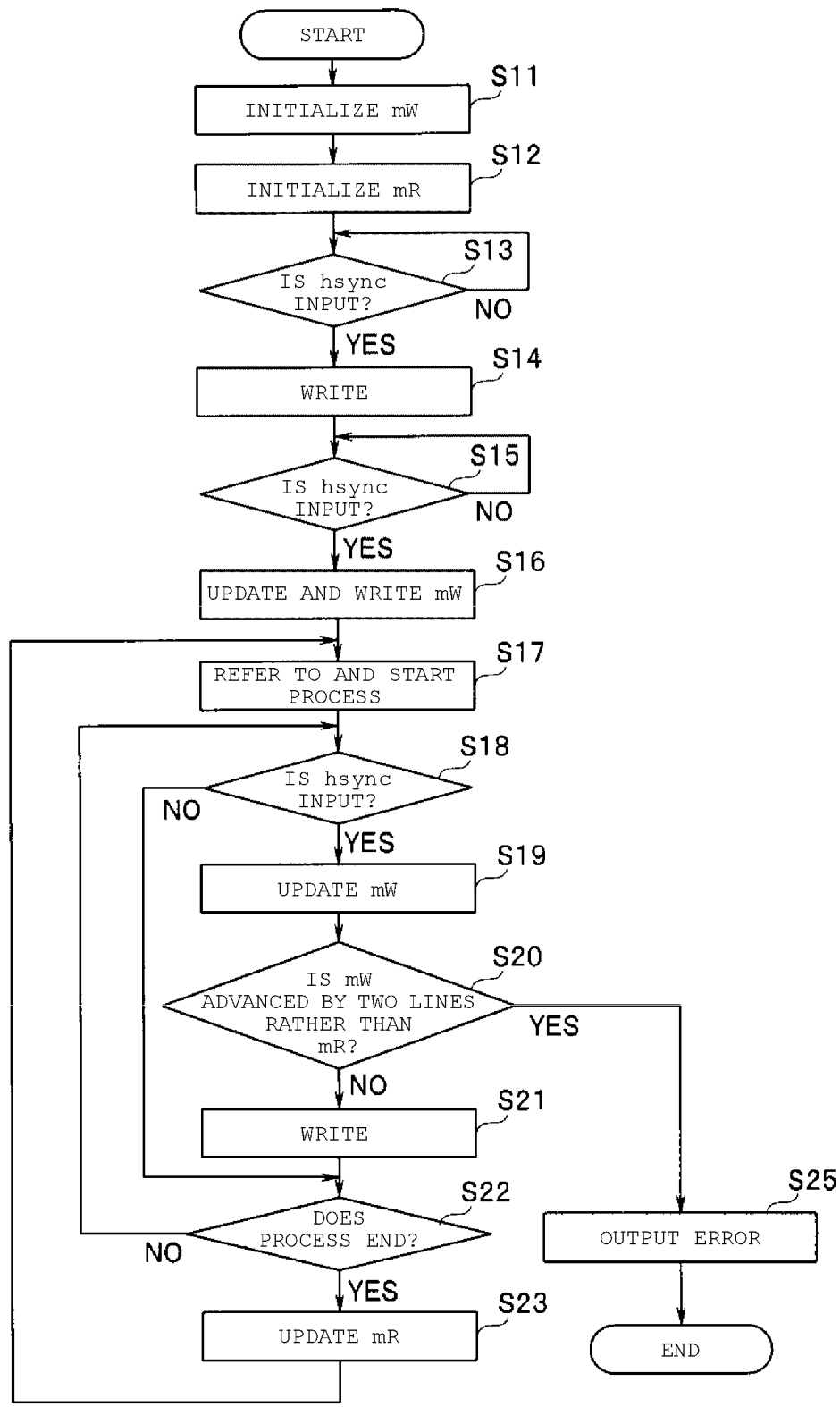
FIG. 9 is a flowchart illustrating control of a read ID and a write ID and control of the image processing.

Subsequently, an operation according to the embodiment which is configured as described above will be described with reference to FIGS. 9 and 10. FIG. 9 is a flowchart illustrating control of the read ID and the write ID and control of the image processing. In addition, FIG. 10 is a diagram illustrating a processing sequence when the smoothing process according to the embodiment is performed in the image processing unit 33 which has image processing performance that is assumed in FIG. 8 with respect to the same image input as in FIG. 8.

In the embodiment, the input line buffer 32 includes one line buffer [2] whose line buffer ID is [2] in addition to the two line buffers [0] and [1] of FIG. 8. In FIG. 9, mW indicates the write ID and mR indicates the read ID. In addition, in FIG. 10, a horizontal axis indicates time and vertical lines indicate input timings of horizontal synchronizing signals hsync(m0) to (m4).

Figure 10:
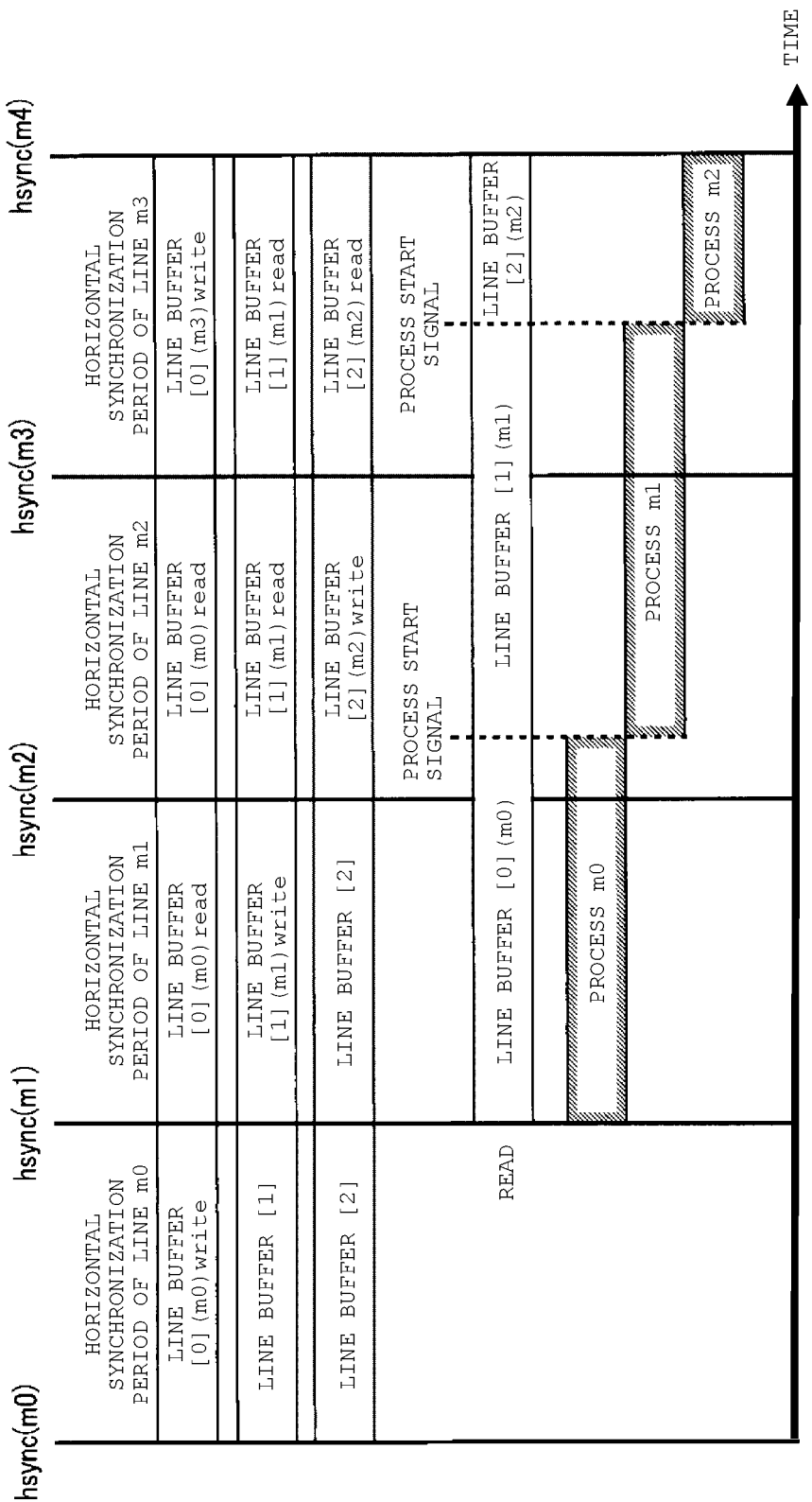
FIG. 10 is a diagram illustrating a processing sequence according to a first embodiment.

As illustrated in FIG. 10, it is assumed that pixel data of consecutive lines m0, m1, m2, . . . is input as the pixel data input to the input line buffer 32 in real time. In steps S11 and S12 of FIG. 9, the control unit 31 initializes a variable mW indicative of the write ID and a variable mR indicative of the read ID, and stores the variables in the memory 31a. In an example of FIG. 10, the control unit 31 performs setting such that mW, mR=[0] as an initial value. Therefore, the line buffer [0] is designated as a write target line buffer, and a line buffer [0] is designated as a read target line buffer. When the variables mW and mR, which are stored in the memory 31a, are updated, the control unit 31 updates the variables in order of, for example, [0], [1], [2], [0], [1], [2] . . . , and itinerantly uses the three line buffers.

In step S13, the control unit 31 determines whether or not the horizontal synchronizing signal hsync is input, and waits for the horizontal synchronizing signal hsync to be input. When the horizontal synchronizing signal hsync(m0) is input, the control unit 31 writes the pixel data input in the input line buffer 32 in step S14. As illustrated in FIG. 10, the input pixel data of the line m0 is written in the line buffer [0].

Subsequently, the control unit 31 waits for the horizontal synchronizing signal hsync to be input in step S15. When the horizontal synchronizing signal hsync(m1) is input, the control unit 31 transitions the process to step S16, updates mW to [1], and writes the pixel data of the line m1 to the line buffer [1]. In addition, here, the busy signal is "0", and the control unit 31 instructs the image processing unit 33 to start the image processing in synchronization with the input of the horizontal synchronizing signal hsync(m1). The image processing unit 33 refers to the read target line buffer [0], and starts the image processing. For example, the image processing unit 33 performs the distortion correction process and sets the busy signal indicative of "being processed" to "1". The image processing unit 33 sequentially outputs the pixel data, which is acquired after the image processing, to the output line buffer 34.

Subsequently, the control unit 31 determines whether or not the horizontal synchronizing signal hsync is input in step S18. When the horizontal synchronizing signal hsync is not input, the control unit 31 transitions the process to step S22. When the horizontal synchronizing signal hsync is input, the control unit 31 transitions the process to step S19. In steps S19 to S21, the input pixel data is written in the line buffers. That is, regardless whether or not the image processing unit 33 ends the image processing, the control unit 31 writes the pixel data when the horizontal synchronizing signal hsync is input. Therefore, it is possible to capture the pixel data in real time.

As described above, the lines m1 and m2 are lines in which the number of peak cycles is necessary for the processing, and the process m0 does not end in the horizontal synchronization period of the line m1. The control unit 31 updates mW in step S19 when the horizontal synchronizing signal hsync(m2) is input, and writes the input pixel data in the input line buffer 32 regardless of the busy signal in step S21 after determination is performed in step S20 which will be described later. That is, here, as illustrated in FIG. 10, mW is [2] and the pixel data of the line m2 is written in the line buffer [2].

In the embodiment, in subsequent step S22, the control unit 31 determines whether or not the process corresponding to one line ends using the busy signal from the image processing unit 33. In the example of FIG. 10, the process m0 with respect to the line m0 does not end at a point of time in which the horizontal synchronizing signal hsync(m2) is input, and thus the control unit 31 returns the process to step S18 and waits for the horizontal synchronizing signal hsync to be input. That is, in the embodiment, the image processing unit 33 performs the image processing with respect to the line m0 over the horizontal synchronization period of the line m1 and the horizontal synchronization period of the line m2. Even in this case, in the embodiment, the line buffer [2] is added, and it is possible to write the pixel data of the line m2 without writing the pixel data in the line buffer [0]. Therefore, even in the horizontal synchronization period of the line m2, it is possible to refer to the pixel data, which is necessary for the process m0, from the line buffer [0].

When the image processing with respect to the line m0 ends, the image processing unit 33 changes the busy signal from "1" to "0". When the busy signal from the image processing unit 33 changes to "0" and the control unit 31 detects that the process ends, the control unit 31 updates mR in step S23 and returns the process to step S17. mR is updated to [1] and the control unit 31 outputs the process start signal to the image processing unit 33 and starts the process in step S17. The image processing unit 33 changes the busy signal to "1", refers to the pixel data of the line m1 stored in the line buffer [1], and starts the image processing.

When the pixel data is written in the line buffer of the output line buffer 34, the control unit 31 outputs the pixel data from the line buffer in the next processing unit. The output from the output line buffer 34 is controlled by the control unit 31 and is performed in synchronization with the horizontal synchronizing signal hsync.

Subsequently, when the same operation is repeated and the horizontal synchronizing signal hsync(m3) is input, mW is updated to [0] (step S19) and the pixel data of the line m3 is written in the line buffer [0]. In addition, in a case where the busy signal "0", which indicates the end of the process of the line m1, is given from the image processing unit 33 in the middle of the horizontal synchronization period of the line m3, mR is updated to [2] (step S23), the pixel data of the line m2 stored in the line buffer [2] is referred to, and the image processing starts. In the example of FIG. 10, the process m2 performed on the line m2 ends until timing in which the horizontal synchronizing signal hsync(m4) is input.

In the embodiment, it is possible to smooth the number of cycles to be processed in each horizontal synchronization period, and, even when a period longer than one horizontal synchronization period is necessary to process the number of peak cycles in the image processing unit 33, it is possible to continue the process while the image processing does not fail.

In step S20, it is determined whether or not mW is advanced by two or more lines than mR. In the example of FIG. 10, one line buffer [2] is added, and the process does not fail even when the write ID is advanced by two lines rather than the read ID. However, when the write ID is advanced by three lines rather than the read ID, for example, when the write ID is [0] which is subsequent to [2] while the read ID is [0] in FIG. 10, it is not possible to refer to the process m0, and thus the process fails. Here, the image processing unit 33 is controlled by the control unit 31 and outputs an error output which indicates that the process fails in step S25.

The two lines in step S20 correspond to an example when one line buffer is added. When the number of line buffers to be added increases, the number of lines in step S20 becomes large, and thus it is apparent that the process unlikely fails.

Evaluation

When a predetermined lens is used as the optical system of the image capturing unit 22, evaluation is performed on the number of cycles which are necessary for the distortion correction in one horizontal synchronization period. The evaluation is performed on the 43 test patterns in which image sizes and lenses are changed. FIG. 11 is a diagram illustrating the change in the number of cycles necessary for completing the distortion process for each line. In FIG. 11, the horizontal axis indicates the number of cycles and the vertical axis indicates the line of the screen. Broken lines in FIG. 11 indicate properties acquired when the number of peak cycles is processed in one horizontal synchronizing using the line buffers corresponding to two lines, similar to FIG. 6. In addition, a solid line in FIG. 11 illustrates properties, acquired when the distortion correction is performed without a break when a smaller number of processes than the number of peak cycles are performed in one horizontal synchronization period through the smoothing process using the line buffers corresponding to three lines, for the same image processing indicated using the broken line. As illustrated in FIG. 11, the number of cycles in one horizontal synchronization period, in which it is possible to perform the distortion correction through smoothing without a break, is reduced for the lines in which it is necessary to process the number of peak cycles.

FIG. 12 is a table illustrating a maximum value of the number of cycles to be processed in one horizontal synchronization period (hereinafter, referred to as the number of smoothed peak cycles) for each number of line buffers where the number of peak cycles is set to 1 and the circuit is designed such that the process does not fail through smoothing according to the embodiment for the 43 test patterns which are used for the evaluation.

In FIG. 12, a number 2, which is the number of buffers, indicates a case where write and read are set to different line buffers one by one, that is, a case where the smoothing process according to the embodiment is not used, and the number of cycles to be processed in one horizontal synchronization period is the number of peak cycles. In contrast, when the line buffers corresponding to three lines are used, the largest number of smoothed peak cycles is 0.99 in the 43 test patterns, the smallest number of smoothed peak cycles is 0.64, and the average number of smoothed peak cycles is 0.94. That is, when the number of line buffers is added one by one, it is possible to reduce the number of cycles to be processed in one horizontal synchronization period by 6% at an average and it is possible to sufficiently improve cost performance.

As being apparent from FIG. 12, even when the number of line buffers is any of 4, 6, 10, 18, and 34, it is understood that all the largest number of smoothed peak cycles, the smallest number of smoothed peak cycles, and the average number of smoothed peak cycles in the 43 test patterns are smaller than 1 and it is possible to reduce the number of cycles to be processed in one horizontal synchronization period. Although not illustrated in FIG. 12, it is possible to reduce the number of cycles to be processed in one horizontal synchronization period for all the 43 test patterns. The result indicates that an effect of reducing the number of cycles is high as the number of line buffers to be added is large.

In the embodiment, the line buffers corresponding to one or more lines are added and the write target line buffer is switched over using a signal indicative of the end of the process in units of each line, and thus it is possible to perform the process in units of a line over the plurality of horizontal synchronization periods and it is possible to smooth the number of cycles which are necessary for one horizontal synchronization period. In addition, write is performed in synchronization with the horizontal synchronizing signal, and it is possible to acquire the pixel data in real time. In this manner, it is possible to perform the process without a break using a circuit having a processing capability of processing the number of cycles, which is smaller than the number of peak cycles, in one horizontal synchronization period, and it is possible to improve cost performance.

Second Embodiment

Figure 14:
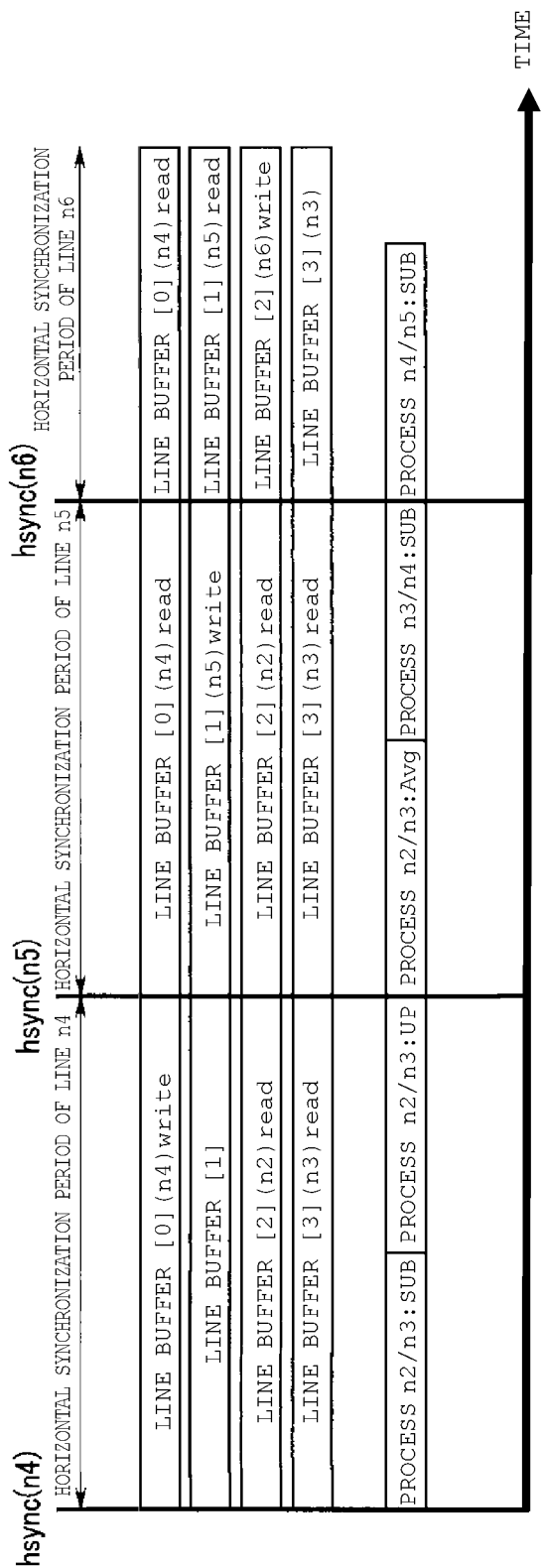
FIG. 14 is a diagram showing a processing sequence of pixel data in units of a line according to the second embodiment.

FIGS. 13 and 14 are explanatory diagrams illustrating a second embodiment of the present disclosure. A hardware configuration according to the embodiment is the same as in FIG. 1. The embodiment is applied to an image processing apparatus which performs a compression process as the image processing.

The image processing unit 33 is configured such that pixel data is input thereto through the input line buffer 32 under the control of the control unit 31, is configured to perform the compression process in units of a line or in units of a block and to output a result of the compression process to the output line buffer 34. It is possible for the image processing unit 33 to perform the compression process using a plurality of compression methods. For example, the image processing unit 33 uses portable network graphics (PNG) compression, and is configured to be able to select a SUB filter for acquiring a difference from a left pixel value, an UP filter for acquiring a difference from a right-above pixel value, an AVG filter for acquiring a difference from an average of the left and right-above pixel values, a Paeth filter for computing a Paeth value from three pixels, that is, the left pixel, the right-above pixel, and an upper left pixel, and acquiring a difference from the value, and a None filter which does not perform the compression process.

Accordingly, in order to perform the compression process using the respective filters in the PNG compression, it is necessary that the input line buffer 32 holds pixel data corresponding to at least two lines. That is, a circuit, which performs the PNG compression, performs compression using pixel data corresponding to maximally two lines, and thus it is necessary to include line buffers corresponding to total three lines using line buffers which hold pixel data corresponding to two lines and a line buffer which holds pixel data corresponding to one line for read.

The image processing unit 33 performs the compression process a plurality of times while switching over the filters such that a desired compression ratio is acquired. Here, it is assumed that the image processing unit 33 is designed such that it is possible to perform the compression process two times in one horizontal synchronization period. Here, when the line buffers corresponding to total three lines including two lines for write and one line for read are used and compression is performed on the pixel data corresponding to one line using 3 types of compression methods, it is not possible to complete the compression process in one horizontal synchronization period, and thus the process fails.

Therefore, in the embodiment, the input line buffer 32 uses line buffers corresponding to total four lines, that is, line buffers corresponding to two lines for read in addition to line buffers corresponding to two lines for write, and thus the number of cycles which are necessary for the process is smoothed, similar to the first embodiment.

Subsequently, an operation according to the embodiment which is configured as described above will be described with reference to FIGS. 13 and 14. FIG. 13 is a diagram illustrating write and read of the input line buffer 32 according to the embodiment.

In FIG. 13, [0] to [3] indicate line buffer IDs of respective line buffers in the input line buffer 32. FIG. 13 illustrates that the horizontal synchronizing signal hsync is generated with respect to start locations of the respective lines included in one screen. In the embodiment, write to the line buffers is performed in synchronization with the horizontal synchronizing signal hsync. The example of FIG. 13 illustrates write lines and read lines when write corresponding to two lines is performed in the two line buffers and read is performed from the line buffers corresponding to the two lines after the write ends so as to be used for the compression process. In the example of FIG. 13, in synchronization with the horizontal synchronizing signal, pixel data in a line n0 and a line n1 is written in a line buffer [0] and a line buffer [1], respectively, and pixel data in a line n2 and a line n3 is read from a line buffer [2] and a line buffer [3], respectively.

FIG. 14 is a diagram illustrating a processing sequence when a smoothing process according to the embodiment is performed. In FIG. 14, a horizontal axis indicates time and vertical lines indicate input timings of horizontal synchronizing signals hsync. As illustrated in FIG. 14, pixel data in consecutive lines . . . , n0, n1, n2, . . . is input to the input line buffer 32 in real time as the input pixel data.

For example, the image processing unit 33 first performs compression using the SUB filter. When a desired compression ratio is accomplished through the compression, the image processing unit 33 ends the compression process on the line. When the desired compression ratio is not acquired, compression using, for example, the UP filter is subsequently performed. The image processing unit 33 performs the compression at the desired compression ratio by switching over the filters of the PNG compression, and outputs pixel data acquired after the compression to the output line buffer 34.

In the example of FIG. 14, it is assumed that pixel data of the lines n2 and n3 is stored in the line buffers [2] and [3] of the input line buffer 32 at a point of time in which a horizontal synchronizing signal hsync(n4) is input to the control unit 31. When the horizontal synchronizing signal hsync(n4) is input, pixel data of the line n4 is written in the line buffer [0] in a horizontal synchronization period of the line n4. In addition, in the horizontal synchronization period of the line n4, the pixel data of the line n2 is read from the line buffer [2] and the pixel data of the line n3 is read from the line buffer [3], and are used for the compression process performed on the line n2. That is, the image processing unit 33 first selects the SUB filter and performs the compression process on each pixel using the difference from the pixel value of the left pixel. When the desired compression ratio is not acquired through the compression process using the SUB filter, the image processing unit 33 subsequently uses the UP filter and performs compression on each pixel using the difference from the right-above pixel value.

Here, it is assumed that the desired compression ratio is not acquired even through the compression process using the UP filter performed by the image processing unit 33. When the smoothing process according to the embodiment is not used, it is necessary to end the process performed on the line n2 in a state in which the desired compression ratio is not acquired or it is necessary to design the image processing unit 33 such that it is possible to perform the compression process three or more times in one horizontal synchronization period.

In contrast, in the embodiment, one line buffer is added, and it is not necessary to perform writing on the line buffer [2] in a horizontal synchronization period of a line n5. In addition, the end of the compression process is detected using the busy signal, the write ID and the read ID of the line buffer are controlled based on a result of the detection, and it is possible to extend and perform the compression process performed on the line n2 to the horizontal synchronization period of the line n5. The image processing unit 33 performs a third compression process with respect to the line n2 based on a difference from an average value between the left pixel and the right-above pixel using the Avg filter in the horizontal synchronization period of the line n5. Therefore, when the desired compression ratio is acquired, the image processing unit 33 starts the compression process with respect to the line n3 after the process performed on the line n2 ends.

In this manner, the compression process does not fail, and it is possible to perform the compression process three times in one horizontal synchronization period. Here, due to an input of a horizontal synchronizing signal hsync (h5), the pixel data of the line n5 is written in the line buffer [1] and it is possible to write the pixel data in real time.

When the processing time is the same in all the compression methods, compared to a case where it is possible to perform the compress method two times in one line period, it is possible to perform the compression method maximally four times by adding one line in the embodiment.

Even in the embodiment, it is possible to acquire the same advantages as in the first embodiment.

Modification Example

The image processing apparatuses according to the respective embodiments perform the process on images which are input in real time in units of a line. As such an apparatus, various apparatuses may be taken into consideration in addition to the distortion correction apparatus and the compression apparatus.

For example, the embodiment may be applied to an image processing apparatus which performs a sharpening process or a shading process.

The processes are used to perform an arithmetic operation using a plurality of pixel data in a prescribed pixel area. For example, the sharpening process for increasing a sense of resolution, the shading process for blurring an image, and the like are performed through the arithmetic operation using the respective pixel data of a pixel area of 3×3 pixels or 5×5 pixels around the pixel of interest. Here, an arithmetic operation quantity of a filter size corresponding to the pixel area of 5×5 pixels is, for example, 25/9 times of an arithmetic operation quantity of a filter size corresponding to the pixel area of 3×3 pixels.

The image processing is performed by switching over the filter size to be used according to edge density of an image part which includes the pixel of interest. Here, in order to perform a secure process in one horizontal synchronization period, it is necessary to design a circuit while assuming that an arithmetic operation is performed using a largest filter size for all the pixels when the smoothing process according to each of the embodiments is not used.

In contrast, similar to each of the above-described embodiments, it is possible to perform a filter process on each line over the plurality of lines by adding one or more line buffers to a number of line buffers which are necessary for an original filter process, detecting the end of the filter process performed on each line using the busy signal, and controlling the write ID and the read ID of each of the line buffers based on a result of the detection. Therefore, it is possible to reduce the number of arithmetic operations which are necessary to be performed by the image processing unit 33 in one horizontal synchronization period.

In addition, the embodiment may be applied to an image processing apparatus which performs a mosaic process. Even in the mosaic process, the filter size may be changed according to a color, and it is possible to reduce the number of arithmetic operations which are necessary to be performed by the image processing unit 33 in one horizontal synchronization period by applying the same smoothing process as in each of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image processing apparatus comprising:
    first, second, and third line buffers;
    an image processing circuit configured to perform image processing on pixel data; and
    a controller configured to:
        determine whether the image processing circuit has completed the image processing on first pixel data stored in the first line buffer within a period of a synchronizing signal,
        upon determining that the image processing circuit has completed the image processing on the first pixel data within the period, control writing of third pixel data into the first line buffer in synchronization with the synchronizing signal, and
        upon determining that the image processing circuit has not completed the image processing on the first pixel data within the period, control writing of the third pixel data into the third line buffer in synchronization with the synchronizing signal.

2. The image processing apparatus according to claim 1, wherein
    when a time period for the image processing by the image processing circuit of the first pixel data stored in the first line buffer is longer than the period of the synchronizing signal, the controller controls, in response to receipt of a signal indicating a completion of the image processing of the first pixel data stored in the first line buffer, the image processing circuit to perform the image processing for second pixel data stored in the second line buffer.

3. The image processing apparatus according to claim 1, further comprising:
    a memory that stores buffer management information used to manage reading and writing statuses of each line buffer.

4. The image processing apparatus according to claim 1, wherein
    the image processing is a distortion correction process.

5. The image processing apparatus according to claim 1, further comprising:
    an output buffer that outputs pixel data, which is acquired after the imaging processing is performed by the image processing circuit, at a timing aligned with the synchronizing signal.

6. The image processing apparatus according to claim 1, further comprising:
    an image sensor configured to output pixel data line by line, wherein
    the first pixel data, second pixel data, and the third pixel data are output from the image sensor and are written into the line buffers in synchronization with the synchronizing signal.

7. A method performed by an image processing apparatus that includes first, second, and third line buffers and an image processing circuit configured to perform image processing on pixel data, the method comprising:
    determining whether the image processing circuit has completed the image processing on first pixel data stored in the first line buffer within a period of a synchronizing signal;
    upon determining that the image processing circuit has completed the image processing on the first pixel data within the period, controlling writing of third pixel data into the first line buffer in synchronization with the synchronizing signal; and
    upon determining that the image processing circuit has not completed the image processing on the first pixel data within the period, controlling writing of the third pixel data into the third line buffer in synchronization with the synchronizing signal.

8. The method according to claim 7, further comprising:
    storing buffer management information used to manage reading and writing statuses of each line buffer.

9. The method according to claim 7, further comprising:
    outputting, by an image sensor, pixel data line by line, wherein
    the first pixel data, second pixel data, and the third pixel data are output from the image sensor and are written into the line buffers in synchronization with the synchronizing signal.

* * * * *